(12) United States Patent
Barbic et al.

(10) Patent No.: US 7,193,415 B2
(45) Date of Patent: Mar. 20, 2007

(54) MAGNETIC LENS, METHOD AND FOCUS VOLUME IMAGING MRI

(75) Inventors: Mladen Barbic, San Gabriel, CA (US); Axel Sherer, Laguna Beach, CA (US)

(73) Assignee: California Institute of Technology, Pasadena, CA (US)

( * ) Notice: Subject to any disclaimer, the term of this patent is extended or adjusted under 35 U.S.C. 154(b) by 0 days.

(21) Appl. No.: 11/321,377

(22) Filed: Dec. 29, 2005

(65) Prior Publication Data

US 2006/0220642 A1    Oct. 5, 2006

Related U.S. Application Data

(60) Provisional application No. 60/641,098, filed on Jan. 3, 2005.

(51) Int. Cl.
*G01V 3/00* (2006.01)

(52) U.S. Cl. ............. 324/304; 335/296; 335/299; 335/306

(58) Field of Classification Search .......... None
See application file for complete search history.

(56) References Cited

U.S. PATENT DOCUMENTS 3,708,772 A * 1/1973 Le Franc .............. 335/210
4,057,748 A * 11/1977 Davis .............. 315/3.5
5,617,024 A 4/1997 Simpson et al.
5,696,476 A * 12/1997 Havens et al. .............. 335/216
6,078,872 A 6/2000 Carson et al.
6,081,119 A 6/2000 Carson et al.

OTHER PUBLICATIONS

Damadian, Raymond et al. "Field Focusing Nuclear Magnetic Resonance (FONAR): Visualization of a Tumor in a Live Animal" *Science*, New Series, vol. 194, No. 4272 Dec. 24, 1976.
Drndic, M. et al. "Micro-electromagnets For Atom Manipulation" Applied Physics Letters vol. 72, No. 22 Jun. 1, 1998.
Halbach, Klaus "Application Of Permanent Magnets In Accelerators And Electron Storage Rings (Invited)" J. Appl. Phys. 57 (1), Apr. 15, 1985.
Hinshaw, Waldo S. "Image Formation By Nuclear Magnetic Resonance: The Sensitive-Point Method*" Journal of Applied Physics, vol. 47, No. 8, Aug. 1976.
Weinstein, J.D., and K.G. Libbrecht "Microscopic Magnetic Traps For Neutral Atoms" Physical Review A vol. 52, No. 5 Nov. 1995.

* cited by examiner

*Primary Examiner*—Diego Gutierrez
*Assistant Examiner*—Dixomara Vargas
(74) *Attorney, Agent, or Firm*—Greer, Burns & Crain, Ltd.

(57) ABSTRACT

A ferromagnetic lens in the presence of a DC magnetic field and a smaller AC magnetic field creates a localized minimum of the magnitude of the magnetic field vector of the combined magnetic field in a volume defined in free space away from the lens referred to as the focus volume. The localized minimum can be nonzero, and can create conditions for spin resonance in the focus volume. The focus volume defined in free space away from the lens can be very small, providing excellent resolution for magnetic resonance imaging, for example.

14 Claims, 3 Drawing Sheets

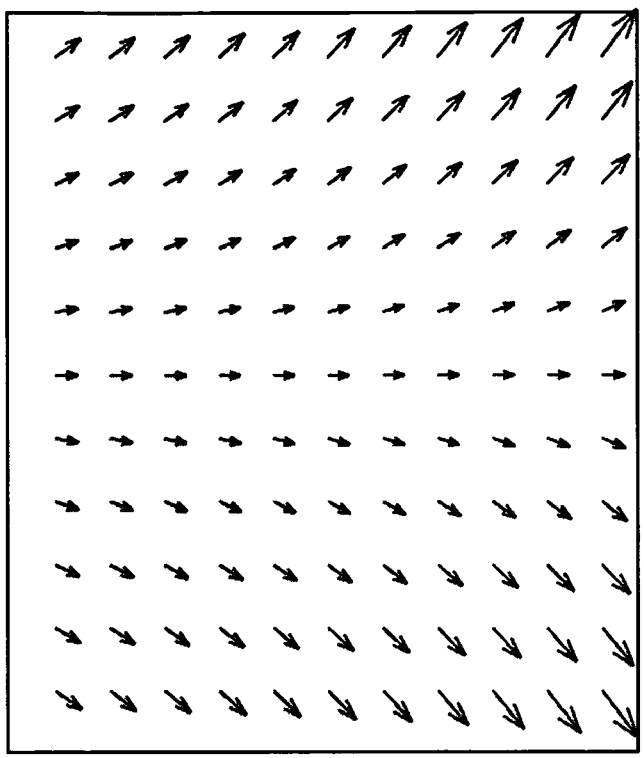
FIG. 3B
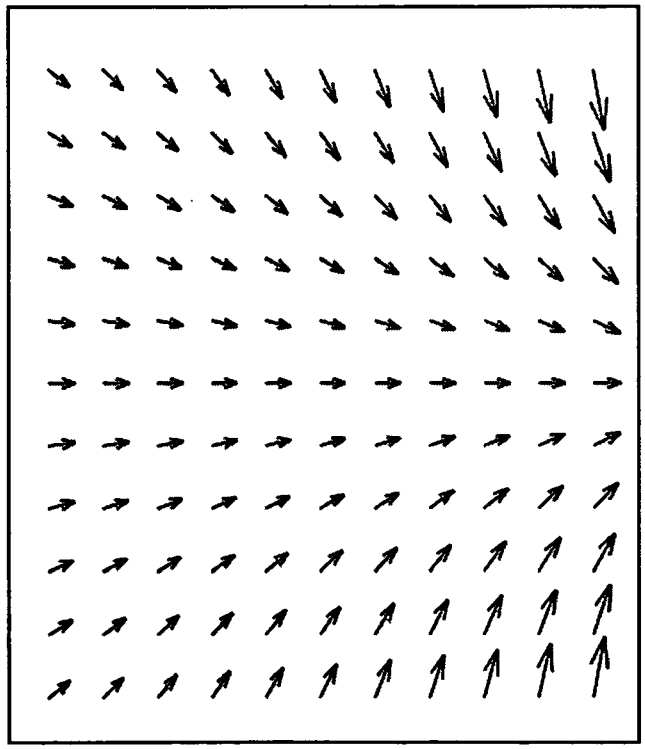
y step = 1nm  FIG. 3A
z(nm)

MAGNETIC LENS, METHOD AND FOCUS VOLUME IMAGING MRI

CLAIM FOR PRIORITY AND REFERENCE TO RELATED APPLICATION

This application claims priority under 35 U.S.C. §119 to prior provisional application 60/641,098 filed Jan. 3, 2005.

STATEMENT OF GOVERNMENT INTEREST

This invention was made with Government assistance from the National Science Foundation under Grant No. DMR 0349319. The Government has certain rights in this invention.

FIELD OF THE INVENTION

A field of the invention is the field of magnetic resonance. Example applications of the invention include, but are not limited to, microscopic resonance imaging, spectrometry, and general resonance imaging. Other exemplary fields of the invention include the fields of plasma physics, particle trapping, and levitation.

BACKGROUND

In devices that rely upon magnetic resonance, a direct current magnetic field is applied and a perpendicular alternating current magnetic field is applied for excitation. The alternating current creates a field that permits resonant spins to be detected in the presence of other spins. Resonance imaging is based upon the fact that images can be calculated from the detected resonance spins. In conventional magnetic resonance imaging (MRI), resonant spins are created in slices. With a plurality of slices, two and three dimensional images can be calculated.

Sensitivity and resolution limits are well-recognized in magnetic resonance imaging devices, and most efforts at improving imaging have been directed at improving detection signal to noise ratios. Example prior techniques to increase the signal to noise ratio include the use of ever higher magnetic fields, better amplifier technology, and application of more efficient pulse sequences and signal processing techniques, among others.

Inductive coils are most frequently used for detection in spectroscopic and imaging settings. Over the years, inductive coil technology has successfully kept pace with improvements in magnet designs. Also, inductive coils in magnetic resonance systems serve the dual important functions of providing both the AC magnetic field to excite the resonant spins in a sample and detecting the signal from a sample.

Other research efforts have sought to change the basic model of inductive detection used in magnetic resonance devices. Alternate detection techniques that have been researched include, for example, force detection, direct transfer of angular momentum, and energy from the spin population in magnetic resonance using micro-mechanical cantilevers. Additional research has been conducted on the flux-detection class of magnetic resonance sensing schemes such as superconducting quantum interference devices, Hall sensors, and superconducting resonators, as well as optical methods.

High resolution three-dimensional imaging is useful for microscopy, and can be used, for example, to study molecular structures. An eventual goal is making practical three-dimensional atomic resolution. Although improvements in imaging resolution through conventional inductive detection have steadily progressed within the last three decades, present spatial resolution is limited to approximately 1 μm in nuclear and electron spin magnetic resonance microscopy. The challenge in improving the imaging resolution results from the extremely weak signals in the magnetic resonance process, spin diffusion, and the limited ability to create sufficiently large gradient fields by current carrying coils.

A recently developed high resolution technique is Magnetic resonance force microscopy (MRFM). MRFM uses a microscopic magnetic particle as a source of atomic scale imaging gradient fields and a mechanical resonator as a sensitive detector of magnetic resonance. The progress in MRFM has recently culminated in the mechanical detection of a single electron spin. With MRFM, mechanical detection of a single electron spin magnetic resonance can be performed on a sample with spatially well-isolated spins, but only after significant averaging per data point, e.g., 13 hours or more. To reduce MRFM averaging time, research is presently focused upon the mechanical detector, magnetic field gradient source, and optical nanoreflectors used in the MRFM technique.

Sensitivity limits in magnetic resonance microscopy are being intensively pursued, primarily through changes to the type of detection that is used. In addition to more advanced micro/nano-mechanical force detectors, several other sensing mechanisms remain viable candidates for improving the imaging sensitivities in detection of small number of spins. These include, for example, the measurement using micro-mechanical cantilevers, flux-detectors such as micro-coils, superconducting quantum interference devices (SQUID), Hall sensors, superconducting resonators, and optical methods. Additionally, single or few spin detection schemes will likely require new methodologies in the area of quantum measurement that deviate significantly for the classical theory of magnetic resonance detection, and have to involve careful consideration of spin polarization and spin noise in a few-spins regime.

Single spin detection might soon be readily accomplished through signal-to-noise improvements under limited conditions. However, the signal-to-noise ratio improvements will be unlikely to succeed in common conditions such as normal imaging conditions. Typical imaging conditions are naturally dense spin environments. With conventional resonant imaging strategies, more than a single spin is resonant and neighboring spins contribute to the detected signal. Conventional resonant image strategies provide slice-selective resonance. Slice based resonance imaging is based upon the resonant condition:

$$\omega(r) = \gamma |B(r)| \tag{1}$$

which defines a scalar relationship between the resonant frequency of the spin, $\omega$, and the magnitude of the magnetic field, $|B|$, at the location of the spin, where $\gamma$ is the gyromagnetic ratio for the nuclear or electron spin. It is the magnitude of the magnetic field at the spin location that determines its resonant frequency, and therefore the slices of constant $|B|$ have to be well understood in order to deconvolve and reconstruct the image from the available data. Generally, due to the size of the polarizing field that must be applied to the sample, only the z-component of the magnetic field from the gradient sources is considered. However, that is an approximation only, and needs to be carefully reconsidered when lower magnetic fields are utilized.

Maxwell's equations place restrictions on the properties of magnetostatic fields in free space. It is impossible for the magnitudes of the components of the magnetic field vector $B_X$, $B_Y$, or $B_Z$ to have a local minimum or maximum in free space. Additionally, the magnetic field magnitude, |B|, cannot have a local maximum, but it can have local minimum in free space. Localized minimums have been generated with current carrying structures and used in the fields of plasma confinement, neutral particle trapping, and levitation. Others have also proposed magnetic resonance imaging techniques that were based on different physical principles for creating what the papers termed as an imaging focus point, and relied on the magnetic field gradients produced by the three-dimensional current carrying wires. See, Damadian, et al., "Field Focusing Nuclear Magnetic Resonance (FONAR): Visualization of a Tumor in a Live Animal," Science 194, 1430 (1976); Hinshaw, "Image Formation by Nuclear Magnetic Resonance: The Sensitive Point Method," J. Appl. Phys. 47, 3709 (1976). The current carrying structures limit practical extensions of the technique.

SUMMARY OF THE INVENTION

The invention provides a magnetic resonance lens to permit measurements of resonance in a volume defined in free space away from a ferromagnetic lens. In an embodiment of the invention, a ferromagnetic lens in the presence of a DC magnetic field and a smaller AC magnetic field creates a localized minimum of the magnitude of the magnetic field vector of the combined magnetic field in a volume defined in free space away from the lens, referred to as the focus volume. The localized minimum can be nonzero, and the lens can create conditions for spin resonance in the focus volume. The focus volume defined in free space away from the lens can be very small, providing excellent resolution for magnetic resonance imaging, for example. Since a lens of the invention alters the manner that resonant spins are created, the lens can be used in any system that measures resonant spins.

Resolution improvements provided by a lens of the invention can improve, for example, resonance imaging microscopy. A lens of the invention is scalable, however, and produces a scalable effect. Namely, the focus volume scales with the lens, and is approximately 100 times smaller than the lens. Macro, micro, and nanoscale lenses of the invention produce focus volumes that can be of interest for different applications.

Additionally, the localized minimum of the magnitude of the magnetic field vector in a volume defined in free space created by a ferromagnetic lens of the invention can be used for additional purposes besides the creation of a localized spin resonance. For example, the lens of the invention provides a favorable alternative that can be used, for example, in confining a plasma, creating a particle trap, or providing levitation. An additional example application is object inspection, for example, to inspect the internal structure of an object for a defect or molecule of interest. As the focus volume is away from the lens, a localized minimum can be created in an object of interest to detect a condition of interest, e.g., the presence of water molecules in an object.

BRIEF DESCRIPTION OF THE DRAWINGS

FIG. 3A (simulation results) is a vector plot of the magnetic field above the plane of the lens of FIG. 1A along the symmetry plane +45 degrees, and FIG. 3B (simulation results) is a vector plot of the magnetic field above the plane of the lens of FIG. 1A along the symmetry plane -45 degrees.

DETAILED DESCRIPTION OF PREFERRED EMBODIMENTS

Figure 1B:
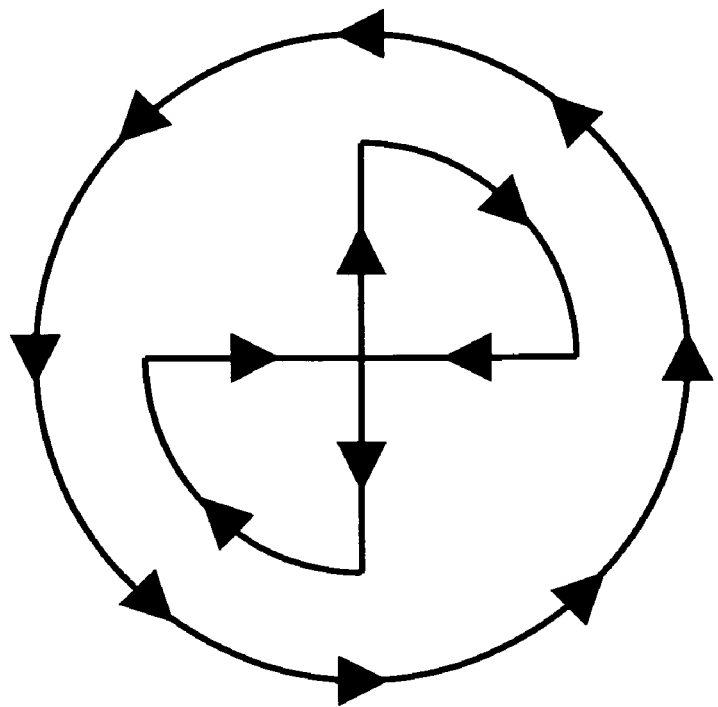
FIG. 1B shows effective circulating Amperian pseudo-currents of the lens of FIG. 1A.

The invention provides a magnetic resonance lens to permit measurements of resonance in a focus volume defined in free space away from the lens. In an embodiment of the invention, a ferromagnetic lens in the presence of a DC magnetic field and a smaller perpendicular AC magnetic field creates a localized minimum of the magnitude of the combined magnetic field vector in a focus volume defined in free space away from the lens. The localized minimum can be nonzero, and can create conditions for spin resonance in the focus volume defined in free space away from the lens. The focus volume defined in free space away from the lens can be very small, providing excellent resolution for magnetic resonance imaging, for example. Since a lens of the invention alters the manner that resonant spins are created, the lens can be used in any system that measures resonant spins.

Embodiments of the invention include a nanoscale ferromagnetic lens that creates a nanoscale focus volume away from the lens. Other embodiments provide microscale and macroscale lenses. The focus volume created by a lens of the invention is approximately 100 times smaller than the diameter of a lens of the invention, and scales with the size of the lens. The focus volume can have a non-zero minimum of the magnetic field vector magnitude. Despite the presence of other spins in the vicinity of the resonant spin, the high gradient magnetic field of the lens in the focus volume renders those spins inactive in the detection process.

Creation of the localized minimum of the magnetic field vector in a volume defined in free space with a ferromagnetic lens of the invention also has other applications apart from resonant spin measurement, imaging and microscopy. Localized minimums of the magnetic field vector have been previously created with current carrying structures for use in plasma physics, particle trapping, and levitation for example. Large currents are required in the prior techniques, and applying a lens of the invention avoids the need to create such currents. The lens of the invention provides a favorable alternative that can be used, for example, in confining a plasma, creating a particle trap, or providing levitation.

With reference to equation (1), a preferred embodiment ferromagnetic lens of the invention creates a volume in three-dimensional space where the magnitude of the magnetic field is a non-zero minimum so that equation (1) is satisfied not for a slice, but for a volume in space. The volume can be very small, e.g., a fraction of a nanometer. In a resonance imaging environment, the ferromagnetic lens creates localized resonance in the volume. The volume size relates to the geometry and size of the lens, which can be made small enough to create a single resonant spin in three-dimensional space that can be detected in the presence of other non-interfering nearby spins.

For example, a preferred embodiment is nanoscale ferromagnetic lens that, in the presence of a DC magnetic field and a smaller perpendicular AC magnetic field, creates a non-zero minimum of the magnetic field magnitude focus volume located away from the structure. Despite the presence of other spins in the vicinity of the resonant spin, the high gradient magnetic fields of the lens ensures that those spins outside the focus volume remain off-resonance, enabling detection of only those spins within the focus volume. In example embodiments, the focus volume has a diameter of a few or tens of nanometers, and can be regularly or irregularly shaped. In preferred embodiments, the focus volume has a diameter of a few nanometers. Larger focus volumes can be of interest, even for microscopy applications, and the focus volume scales with the size of the lens.

Additional preferred embodiments of the invention will now be discussed with reference to the drawings. Physical principles upon which the preferred embodiments are based will also be discussed. Artisans will recognize broader aspects of the invention from the following discussion of preferred embodiments and physical principles. Additional embodiments of the invention will also be apparent to artisans from the following discussion. The preferred embodiments will be discussed with respect to a preferred magnetic resonance imaging applications, but artisans will also understand the broader applicability of the invention.

Figure 1A:
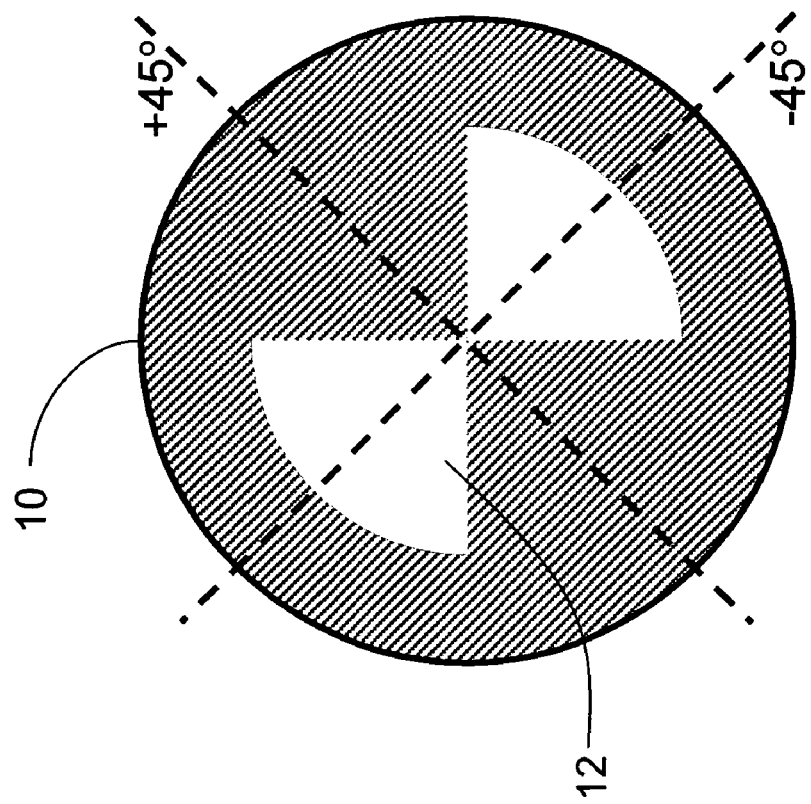
FIG. 1A shows a preferred embodiment ferromagnetic resonance lens of the invention.

FIG. 1A shows a preferred embodiment magnetic resonance microscopy lens 10 of the invention. The lens 10 is thin circular disk of ferromagnetic material in the x-y plane with a perpendicular anisotropy axis so that it is permanently magnetized along the z-direction (out of the page). The lens 10 includes two quarter-circle cut-outs 12. The pie-shaped cut-outs 12 are diagonally opposed and are bounded by a radius that defines a concentric circle with the thin circular disk. Together, the cut-outs resemble a bowtie shape cut from the center of the disk.

Two axes of symmetry along +45 and −45 degrees are indicated in FIG. 1A. For the lens 10 to have a local out-of-plane non-zero magnetic field magnitude minimum in a focus volume, the lens must be placed in a constant bias magnetic field in the direction opposite to the magnetization direction of the structure (into the page).

FIG. 1B illustrates the effective circulating Amperian pseudo-currents of the lens 10. As seen in FIG. 1B, the currents consist of one outer counter-clockwise full-loop current, two inner clock-wise quarter-loop currents, and four straight current lines. All of the currents have the same magnitude, and the outside radius is 1.5 times the inner radius of the structure.

The Amperian pseudo-currents shown are analogous to those produced by others with current carrying structures for particle trapping. See, i.e., Weinstein and Libbrecht, "Microscopic Magentic Traps for Neutral Atoms," *Phys. Rev. A* 52, 4004 (1995). However, at the nanoscale size, the ferromagnet will produce higher fields than an electromagnet and is scalable without loss in field strength. While this relative property of ferromagnets and electromagnets has been known (See, e.g., Halbach, "Application of Permanent Magnets in Accelerators and Electron Storage Rings," J. Appl. Phys. 57, 3605 (1985)) others have nonetheless turned to electromagnet current carrying structures to implement, for example, neutral particle trapping and levitation. Current carrying structures in the contemplated high resolution resonance imaging environment are impractical due to the low fields produced and the need to provide leads and an outside power supply. A ferromagnetic nanoscale lens in accordance with an embodiment of the invention produces the necessary field strength, and also provides the increase in magnetic field gradients and curvatures required for ultra-high magnetic resonance imaging resolution. Also, due to the quantum mechanical exchange interaction responsible for ferromagnetism of the structure, the system generates no heat and requires no heat dissipation.

Accordingly, a lens 10 of the invention can be used in a resonance imaging environment, and will also provide better performance for other applications, e.g., particle trapping. A preferred embodiment lens is scaled to produce a nanoscale focus volume when correctly disposed in a constant bias magnetic field. Example dimensions and a simulated lens will be discussed. The dimensions are exemplary, and are stated so that artisans can appreciate the simulation results that are presented. The scalability preferred embodiment lenses of the invention will be appreciated by artisans.

Simulation Example

In discussing a simulated lens consistent with FIG. 1A, the following parameters are used: (a) the perpendicular anisotropy magnetic material has $\mu_0 M=2$(Tesla), (b) the outer radius of the lens is 60 nm, (c) the inner radius of the concentric circle bounding the cut-outs is 40 nm, (d) the thickness of the structure is 10 (nm), and (e) the bias magnetic field in direction opposite to the magnetization is $B_{BIAS}=-650$ (Gauss). Artisans will appreciate that the dimensions are exemplary, and the structure is scalable. A larger lens will produce the same magnetic field features, albeit at a reduced spatial resolution performance.

Magnetic material with the required perpendicular anisotropy axis is currently used in the magnetic recording industry, and the available coercivity is more than sufficient to sustain the opposing magnetic field of −650 (Gauss). The dimensions of the example lens nanostructure are well within the capabilities of the state-of-the-art lithography or focused-ion-beam (FIB) technology, for example. The selection of the magnetic material used should preferably include careful consideration of magnetic fluctuations to minimize quantum decoherence.

Figure 2B:
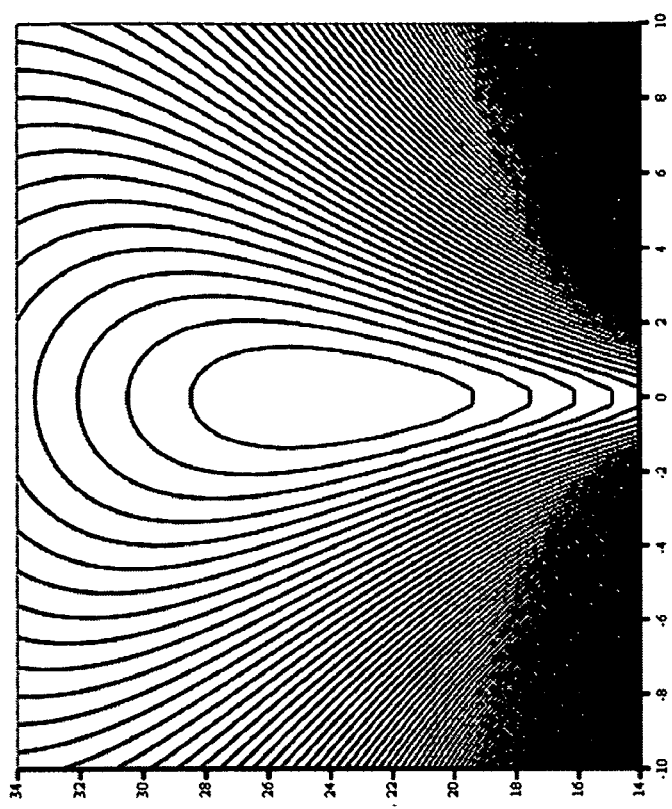
FIG. 2B (simulation results) shows the contours of the constant magnitude of magnetic field above the lens of FIG. 1A along the -45 degrees symmetry plane.
Figure 2A:
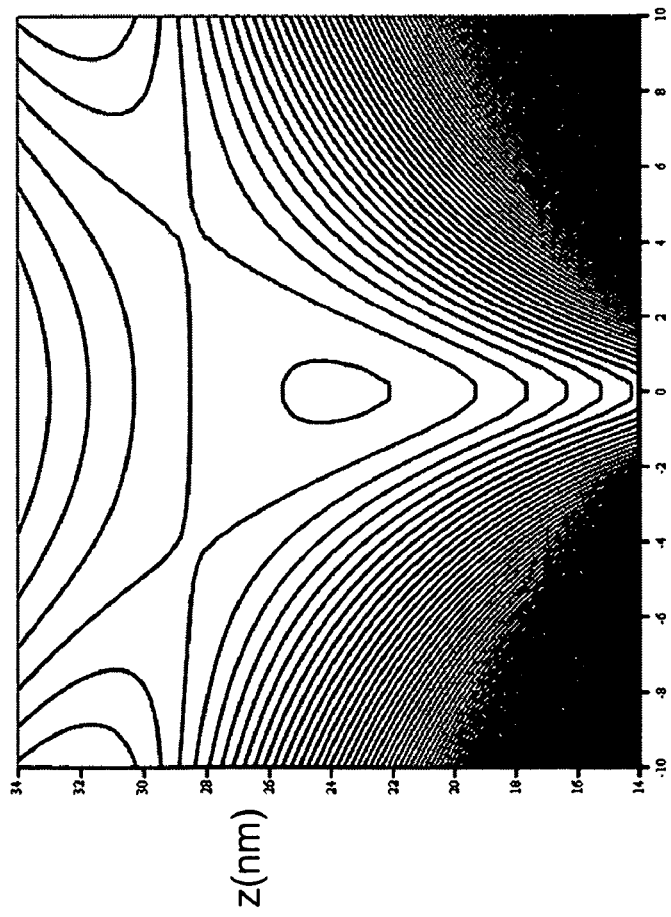
FIG. 2A (simulation results) shows the contours of the constant magnitude of the magnetic field above the lens of FIG. 1A along the +45 degrees symmetry plane.

The magnetic fields above the structure are modeled by assuming a uniform magnetization M directed along the z-axis. Therefore, the uniform positive magnetic pseudo-surface-charge density of n·M is on the top surface, where n is the outward normal of the magnet, and the corresponding negative pseudo-surface-charge density is on the bottom surface. It is possible to numerically compute first the scalar potential $\phi(r)$ and then the magnetic field B(r) at a position r above the plane of the lens:

$$\vec{B}(\vec{r}) = -\mu_0 \nabla \varphi(\vec{r}) = -\mu_0 \nabla \left( \sum_{i=1}^{2} \frac{1}{4\pi} \int_{S_i} \left( \frac{\hat{n}_i \cdot \vec{M}_i}{\vec{r} - \vec{r}'} \right) da' \right) \quad (2)$$

where $\mu_0$ is the permeability of free space. Additional bias field in the negative z-direction $B_{BIAS}=-650$ (Gauss) is also applied. FIGS. 2A and 2B respectively show the contours of constant magnitude of magnetic field B above the structure along the two symmetry planes at +45 and −45 degrees. The figures are 20 nm by 20 nm in size. As intended, the structure produces a non-spherical magnetic field magnitude minimum above the plane. For the parameters used, the minimum is located 23.8 (nm) above the surface and has a value of $B_{MIN}=99.5$ (Gauss). The contours are 6 (Gauss) apart, with the center contour at 100.5 (Gauss). The localized minimum of the magnetic field magnitude only occurs if bias magnetic fields between $B_{BIAS}=-550$ (Gauss) and $B_{BIAS}$=–750 (Gauss) are applied, otherwise a saddle structure is observed in the magnetic field magnitude profiles.

Without regard to sensitivity, the imaging resolution of the magnetic resonance microscopy lens depends on the magnetic field curvatures it produces and the characteristic linewidth of the spin resonance. A spin resonance linewidth of ~1 (Gauss), typical of nuclear spins in a solid state environment, would mean that the lens would be able to frequency separate different spins located approximately 1 (nm) to 4 (nm) apart, as only spins located within the central contours in FIGS. 2A and 2B would be resonant. Despite the potential presence of the nearby spins in the nanometer-scale vicinity of the spins in the focus volume of the lens, the high gradient magnetic field of the lens renders those spins non-resonant, as the condition of equation (1) would not be satisfied for these neighboring spins.

The resonance linewidth of spins in isolated molecules on surfaces could be much narrower than represented in FIGS. 2A and 2B, and potential radio-frequency pulse sequences applied to samples can reduce the resonance linewidths by several orders of magnitude, resulting in an Angstrom scale focus volume of the lens. Under appropriate conditions, three-dimensional atomic resolution magnetic resonance microscopy is possible, as far as the gradient magnetic fields are concerned. For the sub-surface 3-D single electron or proton spin imaging, the angstrom scale motion of the lens can be achieved using the well-developed piezoelectric scanning probe microscopy technology.

While a lens and methods of the invention can be used with any detection/sensing mechanism, a particular preferred application is with a cantilever sensor. In an example embodiment, the magnetic resonance microscopy lens is fabricated on a sufficiently sensitive cantilever. Although the magnitude of the magnetic field is designed to have a localized minimum in three-dimensional space above the plane of the structure, the force on the resonance spin can be non-zero. This can best be seen by showing the vector plots of the magnetic fields around the magnetic field magnitude minimum along the two symmetry planes of the structure as seen in FIGS. 3A and 3B. The size of the view is 10 nm by 10 nm centered at the location of the magnetic field magnitude minimum at z=23.8 (nm). Variation of the magnetic field vector direction and magnitude is clearly visible from the plots. Although the magnetic field vector length has a localized minimum, the components of the magnetic field vector vary along different directions, and that field gradient could be used in the force detection. The force on the spin is:

$$\vec{F} = \nabla(\vec{m} \cdot \vec{B}) \quad (3)$$

and therefore the components of the force on the spin depend on the tensor of the gradient of the magnetic field. Inspection of the vector plots and numerical analysis reveal that only the two gradient components of the gradient magnetic field tensor are non-zero at the focus (Gauss/Angstrom):

$$\begin{pmatrix} \frac{\partial B_X}{\partial x} & \frac{\partial B_Y}{\partial x} & \frac{\partial B_Z}{\partial x} \\ \frac{\partial B_X}{\partial y} & \frac{\partial B_Y}{\partial y} & \frac{\partial B_Z}{\partial y} \\ \frac{\partial B_X}{\partial z} & \frac{\partial B_Y}{\partial z} & \frac{\partial B_Z}{\partial z} \end{pmatrix} = \begin{pmatrix} -2.5 & 0 & 0 \\ 0 & 2.5 & 0 \\ 0 & 0 & 0 \end{pmatrix} \quad (4)$$

Therefore, even if the magnetic field magnitude has a localized extremum at the focus volume of the lens, the resonant spin can experience a non-zero gradient field of 2.5 (Gauss/Angstrom) and be force-detected if sufficient sensitivity and appropriate quantum measurement methodology is available. A focus field of ~100 Gauss for the exemplary embodiment lens corresponds to the ~425 kHz proton resonance frequency, a convenient frequency, as it can closely couple to the common resonant frequencies of micro/nano-mechanical resonators.

As has been mentioned, preferred application of the invention include very high resolution magnetic resonance imaging, conducted with the various detection/sesnsing mechanisms. Artisans will recognize that the scalability of the lens of the invention provides the opportunity to create a focus volume of arbitrary size, from the macro to the nano and fractional nano scale.

While specific embodiments of the present invention have been shown and described, it should be understood that other modifications, substitutions and alternatives are apparent to one of ordinary skill in the art. Such modifications, substitutions and alternatives can be made without departing from the spirit and scope of the invention, which should be determined from the appended claims.

Various features of the invention are set forth in the appended claims.

The invention claimed is:

1. A lens for use in a system including a DC magnetic field and a smaller AC magnetic field together forming a combined magnetic field in space, the lens comprising:
   a ferromagnetic disk having an anisotropy axis permanently magnetized in a direction perpendicular to the disk, the disk being disposed in the combined magnetic field such that the anisotropy axis is opposite the magnetization direction of the DC magnetic field, the disk having cut-outs shaped and dimensioned to create a localized minimum of the magnitude of the magnetic field vector of the combined magnetic field in a focus volume away from the disk.

2. The lens of claim 1, wherein the focus volume has a diameter of tens of nanometers or less.

3. The lens of claim 2, wherein the focus volume has a diameter of a few nanometers.

4. The lens of claim 1, wherein said cut-outs comprise diagonally opposed pie shaped cut-outs bounded by a radius that defines a concentric circle within the disk.

5. The lens of claim 1, wherein said disk and said cut-outs are shaped and dimensioned to produce Amperian pseudo-currents consisting of a full-loop outer counter-clockwise current and two inner clockwise quarter-loop currents and four straight current carrying lines.

6. The lens of claim 1, wherein the system comprises a magnetic resonance imaging system.

7. The lens of claim 1, wherein the magnetic resonance imaging system obtains image information in the focus volume.

8. The lens of claim 1, wherein the localized minimum is non-zero.

9. In a system including a DC magnetic field and a smaller AC magnetic field together forming a combined magnetic field in space, a method for creating a minimum of the magnitude of the magnetic field vector of the combined magnetic field in a focus volume, the method comprising the steps of:
   generating the combined magnetic field; and
   within the combined magnetic field, placing a ferromagnetic disk having perpendicular magnetic anisotropy, the disk being shaped, dimensioned and oriented to create the minimum of the magnitude of the magnetic field vector of the combined magnetic field in a focus volume away from the disk.

10. The method of claim 9 wherein the focus volume has a diameter of tens of nanometers or less.

11. The method of claim 10, wherein the focus volume has a diameter of a few nanometers.

12. The method of claim 9, wherein said cut-outs comprise diagonally opposed pie shaped cut-outs bounded by a radius that defines a concentric circle within the disk.

13. The method of claim 9, wherein said disk and said cut-outs are shaped and dimensioned to produce Amperian pseudo-currents consisting of a full-loop outer counter-clockwise current and two inner clockwise quarter-loop currents and four straight current carrying lines.

14. The method of claim 9, further comprising a step of trapping a particle in the focus volume.

* * * * *